United States Patent
Tateishi et al.

(10) Patent No.: US 6,923,881 B2
(45) Date of Patent: Aug. 2, 2005

(54) METHOD FOR PRODUCING ORGANIC ELECTROLUMINESCENT DEVICE AND TRANSFER MATERIAL USED THEREIN

(75) Inventors: Tomomi Tateishi, Kanagawa-ken (JP); Makoto Yamada, Kanagawa-ken (JP); Nobuhiro Nishita, Kanagawa-ken (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 43 days.

(21) Appl. No.: 10/445,082

(22) Filed: May 27, 2003

(65) Prior Publication Data

US 2003/0221763 A1 Dec. 4, 2003

(30) Foreign Application Priority Data

May 27, 2002 (JP) ........................................ 2002-152785

(51) Int. Cl.[7] .............................. B44C 1/17; B32B 31/20
(52) U.S. Cl. ........................ 156/240; 156/247; 427/96; 427/146; 428/914; 430/199
(58) Field of Search ................................ 156/230, 233, 156/234, 235, 238, 240, 241, 247, 277, 289; 427/9.6, 146, 147, 148; 428/195.1, 200, 202, 204, 208, 209, 901, 914; 430/199, 200, 201, 270.1, 961, 321, 252, 311

(56) References Cited

U.S. PATENT DOCUMENTS

| | | | | |
|---|---|---|---|---|
| 5,032,438 A | * | 7/1991 | Sakumoto et al. | 428/41.8 |
| 6,114,088 A | * | 9/2000 | Wolk et al. | 430/273.1 |
| 6,316,786 B1 | * | 11/2001 | Mueller et al. | 257/40 |
| 2002/0127877 A1 | | 9/2002 | Shibata et al. | |

FOREIGN PATENT DOCUMENTS

WO    WO 00/41893 A1    7/2000

* cited by examiner

*Primary Examiner*—Mark A. Osele
(74) *Attorney, Agent, or Firm*—Birch, Stewart, Kolasch & Birch, LLP

(57) ABSTRACT

A transfer material comprises a temporary support and an electroluminescent element layer, and positioned between said temporary support and said electroluminescent element layer. Using the above transfer material, an organic electroluminescent device is produced by a method comprising the steps of superposing the transfer material on an electrode layer side of a substrate has partially or wholly transparent or opaque electrode layer, contacting the transfer material and the substrate, and transferring at least one electroluminescent element to the electrode layer side of a substrate with at least one heating means and pressing means.

8 Claims, 1 Drawing Sheet

METHOD FOR PRODUCING ORGANIC ELECTROLUMINESCENT DEVICE AND TRANSFER MATERIAL USED THEREIN

FIELD OF THE INVENTION

The present invention relates to a transfer material being capable of making an organic electroluminescent device, and a method for producing an organic electroluminescent device comprising such a transfer material.

BACKGROUND OF THE INVENTION

Much attention is paid to organic light-emitting devices such as organic electrolurminescence (EL) devices usable for flat panel display devices. Specifically, promising as inexpensive, solid-emission-type, large-emission-area, full-color display devices and writing light source arrays, the organic light-emitting devices have been actively developed.

The organic light-emitting device generally comprises a couple of electrodes (a transparent electrode and a rear-surface electrode), and a light-emitting organic layer formed between the electrodes. When an electric field is applied to the organic light-emitting device between a pair of opposing electrodes, electrons are injected into the light-emitting device from the rear-surface electrode, while holes are injected thereinto from the transparent electrode. Electrons and holes are recombined in the light-emitting layer, and energy is emitted as light when an energy level is lowered from a conduction band to a valence band.

The organic layers in the organic light-emitting devices are mostly formed by a vapor deposition method. For instance, JP 9-167684 A and JP 2000-195665 A propose methods comprising uniformly forming an organic layer on a temporary support of mica or a film by a vapor deposition method, bringing the organic layer close to the substrate, and carrying out a heating vapor deposition. However, these methods are poor in productivity because they use a vapor deposition method. In addition, because only low-molecular-weight organic compounds can be used for organic layers in a vapor deposition method, the resultant organic light-emitting devices are insufficient in durability such as bending resistance, film strength, etc., when used for flexible displays, etc. This problem is serious particularly when they have large areas.

In view of the above problems in connection with the use of low-molecular-weight organic compounds, proposals have been made to provide high-molecular-weight organic EL devices comprising light-emitting thin-film layers made of high-molecular-weight compounds, or those composed of low-molecular-weight compounds dispersed in binder resins. For instance, Nature, Vol. 347, page 539, 1990 proposes a green-light-emitting, high-molecular-weight, organic EL device using poly(p-phenylenevinylene). The Japanese Journal of Applied Physics, Vol. 30, page L1938, 1991 proposes a high-molecular-weight, organic EL device using poly(3-alkylthiophene) for emitting red orange light. The Japanese Journal of Applied Physics, Vol. 30, page L1941, 1991 proposes a blue-light-emitting, high-molecular-weight, organic EL device using polyalkylfluorene. These high-molecular-weight devices are advantageous in making large-area, light-emitting devices, and their applications for flexible displays are expected. However, because the vapor deposition method cannot be used to form the organic light-emitting thin-film layers, thin-film layers are formed directly on substrates by wet methods.

The wet methods are, however, disadvantageous in that the formed organic layers are insufficient in the uniformity of thickness because of the surface tension of solutions, and that when a new liquid organic layer is laminated on the already solidified organic layer, the solidified organic layer tends to be dissolved in its interface with the new liquid organic layer. Accordingly, the organic electroluminescent devices obtained by the wet methods are poor in light-emitting uniformity, light-emitting efficiency and durability of devices.

WO 00/41893 discloses a method for thermally transferring an organic layer and a photo-thermal conversion layer onto a substrate by a laser beam by using a donor sheet having an organic layer and a photo-thermal conversion layer. Such a thermal transfer method is disadvantageous in that a gas often penetrates into an interface between the organic layer and the substrate, resulting in poor light-emitting properties. In addition, there is a problem that the light-emitting efficiency, durability and the uniformity of the organic EL device vary depending on the conditions of the interface of the organic layer.

In the case of thermal writing in a predetermined pattern using a thermal head or a laser common in printing technologies, a temperature distribution generated around an organic, thin-film pattern by thermal diffusion blurs its outline, failing to cut the organic, thin-film pattern from the donor accurately. Thus, organic light-emitting devices produced by this method are uneven in light emission and likely to suffer from poor durability, because of insufficient electric connection and the breakage of the organic layer. Further, yield is likely to be low because of low-accuracy positioning of the substrate and the thermal head or laser beam.

OBJECTS OF THE INVENTION

Accordingly, an object of the present invention is to provide a method for forming an organic layer on a substrate by a simple apparatus at a low cost, thereby producing a uniform organic electroluminescent device with a good adhesion interface with a substrate, particularly to a method for producing an organic electroluminescent device excellent in light-emitting efficiency, the uniformity of light emission and durability by forming a uniform organic layer on a substrate.

Another object of the present invention is to provide a transfer material for use in such a method.

SUMMARY OF THE INVENTION

As a result of intense research in view of the above objects, the inventors have found that in a case where an organic layer for forming an organic electroluminescent device is formed on a temporary support and transferred to a substrate, the formation of a peeling layer on a temporary support on a surface on which the organic layer is formed improves the transferability of the organic layer, thereby making it possible to produce an organic electroluminescent device excellent in light-emitting efficiency, the uniformity of light emission and durability at a low cost. The present invention has been accomplished based on this finding.

Thus, the present invention provides a transfer material comprising an organic layer on a temporary support for use in a peeling transfer method for producing an organic electroluminescent device, which comprises overlapping the transfer material on a substrate such that the organic layer side faces a surface to be coated of the substrate, heating and/or pressing them, peeling the temporary support to transfer the organic layer to the surface to be coated of the substrate, wherein a peeling layer is interposed between the temporary support and the organic layer. The peeling layer may contain a component having a peeling function (hereinafter referred to as "peeling agent").

The present invention has been achieved by the following means:

(1) The transfer material for an organic electroluminescent device comprising an organic layer formed on a temporary support, wherein a peeling layer is formed between the temporary support and the organic layer.

(2) The transfer material recited in (1), wherein the peeling layer comprises at least one selected from the group consisting of silicon-containing compounds, fluorine-containing compounds, waxes, inorganic fillers, organic fillers, surfactants and metallic soaps.

(3) The transfer material recited in (2), wherein the silicon-containing compound is selected from the group consisting of silane compounds, silicone oils, silicone rubbers and silicone resins.

(4) The transfer material recited in (2), wherein the fluorine-containing compound is selected from the group consisting of fluorine-containing surfactants, fluorine-containing oils, fluororubbers and fluororesins.

(5) The transfer material recited in (1) to (4), wherein the peeling layer comprises a functional group reactable with a resin forming the temporary support and/or the peeling layer.

(6) The transfer material recited in (1) to (5), wherein the peeling layer has a maximum surface roughness Rmax of 0 to 50 according to JIS B 0601-1982, assuming that the thickness of the organic layer is 100.

(7) The transfer material recited in (1) to (6), wherein the organic layer comprises at least a light-emitting organic compound or a carrier-transporting organic compound.

(8) The method for producing an organic electroluminescent device using the transfer material recited in any one of (1) to (7), comprising overlapping the transfer material on the substrate such that the organic layer side faces a surface to be coated of the substrate, heating and/or pressing them, and peeling the temporary support to transfer the organic layer to the a surface to be coated of the substrate.

(9) The method for producing an organic electroluminescent device recited in (8), wherein the substrate has a transparent or opaque electrode layer on a substrate support in at least part of the surface to be coated.

(10) The method for producing an organic electroluminescent device recited in (8) or (9), wherein a hole-transporting organic layer, a light-emitting organic layer, and an electron-transporting organic layer are transferred in this order from the substrate side.

(11) The method for producing an organic electroluminescent device recited in any one of (8) to (10), wherein the transfer material and/or the substrate is in the form of a continuous web.

(12) The method for producing an organic electroluminescent device recited in any one of (8) to (11), further comprising the step of bonding the surface of the substrate, to which the organic layer is transferred, to a substrate, on which at least one of an electrode, a transparent conductive layer and an organic layer is formed.

(13) The organic electroluminescent device produced by the method recited in any one of (8) to (12), which comprises an anode layer, an organic layer and a cathode layer.

DETAILED DESCRIPTION OF THE PREFERRED EMBODIMENTS

Figure 1:
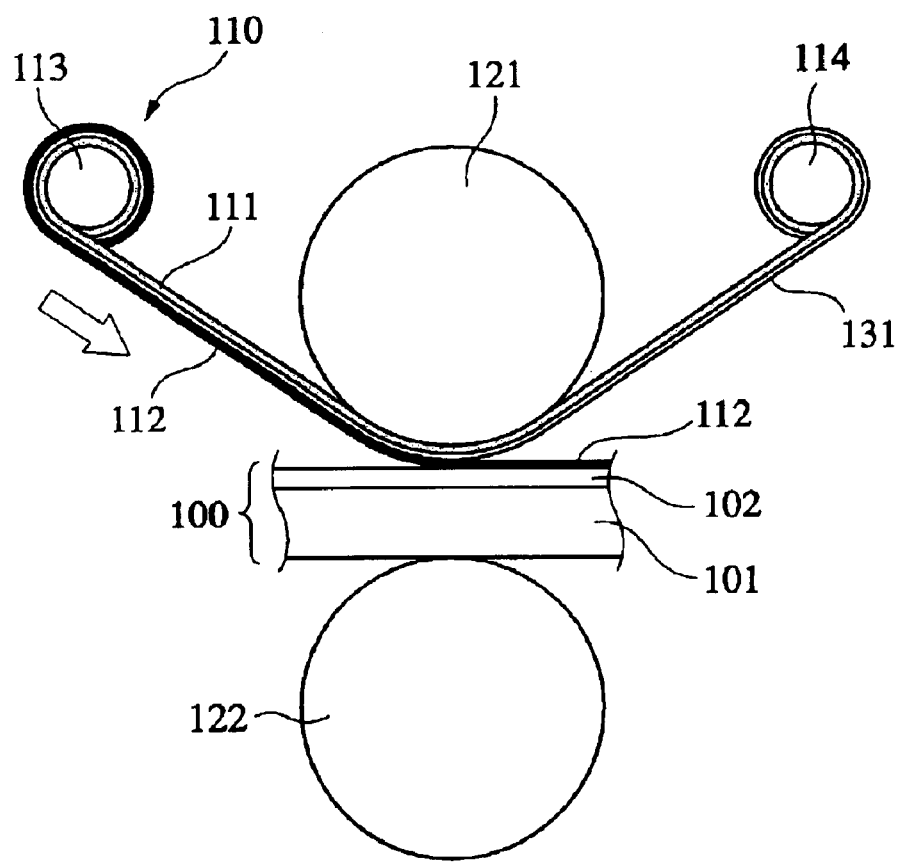
FIG. 1 is a schematic view showing an apparatus for producing an organic electroluminescent device.

Explanation will be made first on the transfer material of the present invention for transferring an organic layer, then on the method for producing an organic electroluminescent device, and finally on the organic electroluminescent device itself.

[1] Transfer Material (Electroluminescent-element Transfer Material)

(1) Structure

The transfer material is constituted of a peeling layer between an electroluminescent element layer and a temporary support. Though the transfer material may properly be produced by a known method, it is preferable to use a wet method (solvent-coating process) from the aspect of productivity. The transfer materials each provided with an organic layer may be produced separately, or a plurality of organic layers may be formed successively on a single temporary support surface. In the latter case, a plurality of organic layers can continuously be formed without necessitating the exchange of the transfer materials. In the present invention, it is preferable that the transfer material does not have a light-to-heat conversion layer.

By using a transfer material constituted by laminating two or more organic layers on a peeling layer on a temporary support in advance, it is possible to laminate a multi-layer film on a surface to be coated of the substrate by a single transferring step. When laminated on a peeling layer on a temporary support in advance, unevenness would occur in the mobility of holes and electrons without a uniform interface in each of the organic layers laminated. To have a uniform interface, it is necessary to carefully select solvents, and organic compounds for organic layers soluble in the solvents.

(2) Temporary Support (Carrier Sheet)

The temporary support used in the present invention should be made of a material that has chemical stability, thermal stability and flexibility. Specific examples of the materials include fluororesins such as a tetrafluoroethylene resin (PTFE), a trifluorochloroethylene resin; polyesters such as polyethylene terephthalate (PET) and polyethylene naphthalate (PEN); polyarylates; polycarbonates; polyolefins such as polyethylene and polypropylene; polyether sulfone (PES); etc. The temporary support is particularly preferably a thin sheet made of at least one of these materials or a laminate thereof. More preferable among them are polyesters such as PET, etc., polyether sulfone, etc. Resins forming the temporary support may comprise reactive groups such as a hydroxyl group, a carboxyl group, an amino group, an epoxy group, an acrylic group and a methacrylic group. The thickness of the temporary support is preferably 1 $\mu$m to 300 $\mu$m, more preferably 3 $\mu$m to 200 $\mu$m, particularly 5 $\mu$m to 150 $\mu$m.

The temporary support may be a single-layer sheet or a laminate sheet. In the case of the laminate sheet, it may have a substrate and at least one flat layer thereon on a side, on which the organic layer is formed. Materials making the flat layer are not particularly restrictive.

A surface treatment for improving the adhesiveness may be carried out on a surface of the temporary support where the organic layer is formed. Such surface treatment includes, for instance, an activation treatment such as a corona discharge treatment, a plasma treatment, an ozone treatment, a flame treatment, a glow discharge treatment, etc. The corona discharge treatment comprises placing a temporary support between a pair of electrodes, and applying a high AC voltage between both electrodes at an atmospheric pressure to generate corona discharge, to which surfaces of the temporary support are exposed, thereby modifying the surface conditions of the temporary support. Corona-generating gases may be mainly He, Ar, $N_2$, CO, $CO_2$, $O_2$, their mixed gases, etc. Because the corona discharge treatment tends to cut the skeletons of the resin on a surface, it is preferably carried out in a short period of time. For this purpose, for instance, a corona discharge nozzle may be swept at a high speed in parallel to the temporary support, or the temporary support may be moved at a high speed.

The plasma discharge treatment can generate more active species at as low pressure as about 0.001 to 0.01 Torr than the corona discharge. However, because the plasma treatment is conducted in vacuum, it cannot easily be carried out continuously, necessitating a large facility. Accordingly, it is preferable that glow discharge plasma or corona discharge using microwaves is generated between discharge electrodes and the temporary support at room temperature and an atmospheric pressure, so that plasma is generated by a high induced electric field at an atmospheric pressure (about 760 Torr). These activation treatments may be carried out alone or in combination.

These activation treatments provide the temporary support surface with hydrophilic groups such as a hydroxyl group, etc., improving its adhesion to a peeling layer formed thereon. The affinity of the temporary support for water can be expressed by a contact angle of water with the temporary support that is determined by the surface tension of water. The contact angle of the surface-activated temporary support to water is preferably 90° or less, more preferably 80° or less, further preferably 70° or less. The contact angle may be measured by an automatic contact angle meter (model CA-Z available from Kyowa Interface Science Co., Ltd.), etc.

(3) Peeling Layer (Separating Layer)

The transfer material of the present invention comprises a peeling layer containing a component having a peeling function (peeling agent) formed on the temporary support on a surface on which an organic layer is formed. The peeling function is a function that when the transfer material is overlapped on a substrate and heated and/or pressed followed by the peeling of a temporary support, the organic layer is efficiency transferred to the substrate without fusing to the temporary support. Most or substantially all of the peeling layer can remain with the temporary support when the electroluminescent-element layer is transferred.

Examples of materials for forming the peeling layer include polyolefins such as polyethylene and polypropylene; vinyl resins such as polyvinyl chloride, polyvinylidene chloride, polyvinyl acetate, vinyl chloride-vinyl acetate copolymers, polyacrylates and polystyrenes; polyester resins such as polyethylene terephthalate and polybutylene terephthalate; polyamide resins; copolymers of olefins such as ethylene, propylene, etc. and vinyl monomers; ionomers; cellulose resins such as ethyl cellulose and cellulose acetate; polycarbonate resins; phenoxy resins, etc. Preferable among them are vinyl resins and polyester resins. These resins may be used alone or in combination.

The peeling layer may comprise a peeling agent. Examples of the peeling agents include silicon-containing compounds (preferably at least one compound selected from the group consisting of silane compounds, silicone oils, silicone rubbers and silicone resins); fluorine-containing compounds (preferably at least one compound selected from the group consisting of fluorine-containing surfactants, fluorine-containing oils, fluororubbers and fluororesins), waxes, inorganic or organic fillers, surfactants, metallic soaps, etc. These peeling agents may be used alone or in combination.

The peeling layer may comprise a functional group reacting with a resin forming the temporary support and/or a resin forming the peeling layer. For instance, by using resins having reactive groups such as a hydroxyl group, a carboxyl group, an amino group, an epoxy group, an acrylic group and a methacrylic group, etc. as resins for the temporary support, and causing these reactive groups to react with silicon-containing compounds, fluorine-containing compounds, etc. having functional groups such as a carboxyl group, a hydroxyl group, an amino group, an epoxy group, an isocyanate group, etc. at ends, it is possible to fix the peeling layer to the temporary support. In addition, silicon-containing compounds, fluorine-containing compounds, etc. having the above functional groups may be added to the peeling layer made of resins having reactive groups such as a hydroxyl group, a carboxyl group, an amino group, an epoxy group, an acrylic group and a methacrylic group, etc., so that the above reactive groups are reacted with the above functional groups in the peeling layer. Cross-linking in the peeling layer cures the peeling layer, thereby increasing its peeling function. The peeling agent having a functional group may react with both of the resin for forming the temporary support and the resin for forming the peeling layer.

The reactive group (a hydrophilic group such as a hydroxyl group, etc.) on the temporary support surface may be formed by the above activation treatment. The reaction of the peeling agent having a functional group with the resin for forming the temporary support and/or the resin for forming the peeling layer may be carried out by heat, light, etc. Accordingly, the reaction may be carried out by a heat-drying step after forming the peeling layer on the temporary support.

Examples of the peeling agents comprising functional groups include silicone oils, silicone resins, fluororesins, fluororubbers, etc. modified with epoxy compounds, vinyl compounds, alkyl compounds, amino compounds, carboxyl compounds, alcohols, fluorine-containing compounds, alkyl aralkyl polyethers, epoxy polyethers, polyethers, etc.

The peeling agents used in the present invention will be explained more specifically below.

(A) Silicon-containing Compounds (a) Silane Compounds

Examples of the silane compounds include $Si(OCH_3)_4$, $CH_3Si(OCH_3)_3$, $HSi(OCH_3)_3$, $(CH_3)_2Si(OCH_3)_2$, $CH_3Si(OCH_3)_2$, $C_6H_5Si(OCH_3)_3$, $Si(OC_2H_5)_4$, $CH_3Si(OC_2H_5)_3$, $(CH_3)_2Si(OC_2H_5)_2$, $H_2Si(OC_2H_5)_2$, $C_6H_5Si(OC_2H_5)_3$, $(CH_3)_2CHCH_2Si(OCH_3)_3$, $CH_3(CH_2)_{11}Si(OC_2H_5)_3$, $CH_3(CH_2)_{15}Si(OC_2H_5)_3$, $CH_3(CH_2)_{17}Si(OC_2H_5)_3$, $(CH_3)_3SiNHSi(CH_3)_3$, $(CH_3SiNH)_2CO$, tert-$C_4H_9(CH_3)_2SiCl$, $HSC_3H_6Si(OCH_3)_3$, silane coupling agents, fluorine-containing silane compounds, isocyanate silane compounds, partially or totally hydrolyzed compounds thereof, etc. Examples of the fluorine-containing silane compounds include $CF_3(CH_2)_2Si(OCH_3)_3$, $C_6F_{13}C_2H_4Si(OCH_3)_3$, $C_7F_{15}CONH(CH_2)_3Si(OC_2H_5)_3$, $C_8F_{17}C_2H_4Si(OCH_3)_3$, $C_8F_{17}C_2H_4SiCH_3(OCH_3)_2$, $C_8F_{17}C_2H_4Si(ON=C(CH_3)(C_2H_5))_3$, $C_9F_{19}C_2H_4Si(OCH_3)_3$, $C_9F_{19}C_2H_4Si(NCO)_3$, $(NCO)_3SiC_2H_4C_6F_{12}C_2H_4Si(NCO)_3$, $C_9F_{19}C_2H_4Si(C_2H_5)(OCH_3)_2$, $(CH_3O)_3SiC_2H_4C_8F_{16}C_2H_4Si(OCH_3)_3$, $(CH_3O)_2(CH_3)SiC_9F_{18}C_2H_4Si(CH_3)(OCH_3)_2$, etc. Examples of the isocyanate silane compounds include $(CH_3)_3SiNCO$, $(CH_3)_2Si(NCO)_2$, $CH_3Si(NCO)_3$, vinylsilyl triisocyanate, $C_6H_5Si(NCO)_3$, $Si(NCO)_4$, $C_2H_5OSi(NCO)_3$, $C_8H_{17}Si(NCO)_3$, $C_{18}H_{37}Si(NCO)_3$, $(NCO)_3SiC_2H_4(NCO)_3$, etc.

(b) Silicone Rubbers

Examples of the silicone rubbers include millable silicone rubbers such as a dimethyl silicone rubber, a methylvinyl silicone rubber, a methylphenylvinyl silicone rubber and a methyl fluoroalkyl silicone rubber; and liquid silicone rubbers such as condensed silicone rubbers, added silicone rubbers, ultraviolet-ray-cured silicone rubbers, etc. These silicone rubbers may be in epoxy-modified, vinyl-modified, amino-modified, carboxyl-modified, alcohol-modified types, etc.

(c) Silicone Resins

Examples of the silicone resins generally include silicone resins having high degrees of polymerization and silicone varnishes having relatively low molecular weights. The silicone varnishes may be a silicone-alkyd varnish, a silicone-epoxy varnish, a silicone-polyester varnish, or modified varnishes obtained by reacting these varnishes with acrylic resins, phenolic resins, polyurethanes, melamine resins, etc. The silicone resins may be those modified with epoxy compounds, vinyl compounds, amino compounds, carboxyl compounds, alcohols, etc.

(d) Silicone Oils

Examples of the silicone oils include those in a dimethyl polysiloxane or methylphenyl polysiloxane type; methyl hydrogen silicone oils; modified silicone oils having reactive groups introduced into molecules, etc.

Usable as the modified silicone oils are carboxyl-modified, amino-modified, epoxy-modified, polyether-modified or alkyl-modified silicone oils, etc. They may be, for instance, modified silicone oils described in "Modified Silicone Oils," Technical Reference issued by the Silicone Division of Shin-Etsu Chemical Co., Ltd., pp. 6 to 18B. When added to organic solvent-type, peeling layer-forming resins, the modified silicone oils are preferably amino-modified silicone oils having groups reactable with the reactive groups (for instance, isocyanates) of the resins. When added to water-soluble resins in an emulsified state, the modified silicone oils are preferably, for instance, carboxyl-modified silicone oils available from the Silicone Division of Shin-Etsu Chemical Co., Ltd. under the trade-name of "X-22-3710." Usable as the modified silicone oils are, for instance, compounds having the following skeleton structures.

Epoxy-modified Silicone Oil

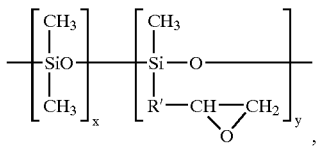

wherein R' represents a bonding group such as —CH$_2$— (this definition similarly applies below).

An example thereof is

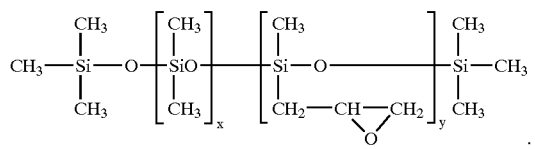

Alkyl-modified Silicone Oil

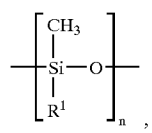

wherein R$^1$ represents alkyl or alkyl/aralkyl. Examples thereof are

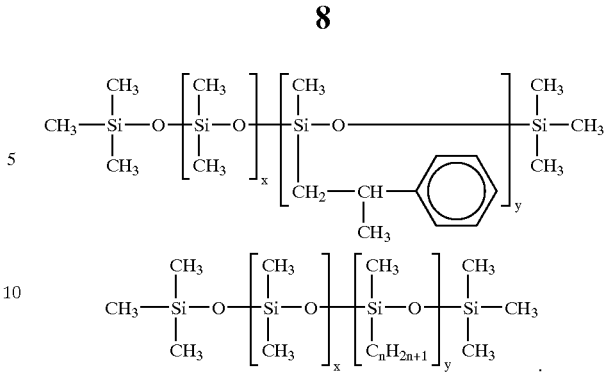

Polyether-modified Silicone Oil

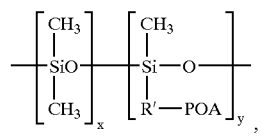

wherein POA represents polyether such as —(CH$_2$O)$_n$—H (this definition similarly applies below).

An example thereof is

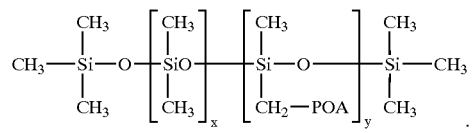

Alcohol-modified Silicone Oil

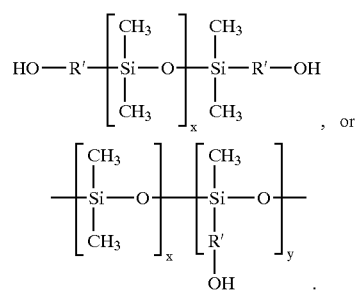

, or

Amino-modified Silicone Oil

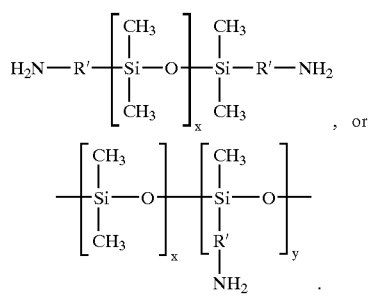

, or

Carboxyl-modified Silicone Oil

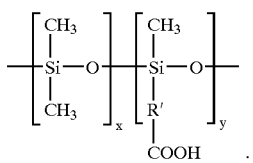

An example thereof is

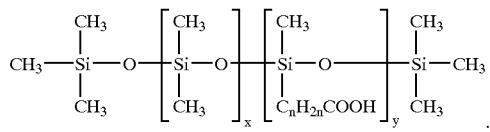

Fluorine-modified Silicone Oil

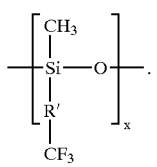

Higher-fatty-acid-modified Silicone Oil

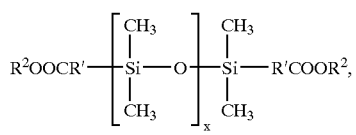

wherein $R^2$ represents an aliphatic hydrocarbon group.
Epoxy/polyether-modified Silicone Oil

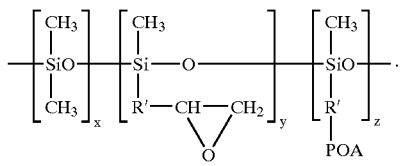

Alkyl/polyether-modified Silicone Oil

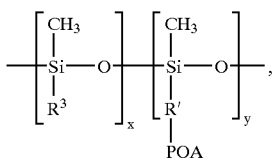

wherein $R^3$ represents an alkyl group.

(B) Fluorine-Containing Compounds

The fluorine-containing compounds may be low- or high-molecular-weight compounds. Examples of the low-molecular-weight, fluorine-containing compounds include compounds described in U.S. Pat. Nos. 3,775,126, 3,589,906, 3,798,265, 3,779,768 and 4,407,937, West German Patent 1,293,189, GB Patent 1259398, JP 48-87826 A, JP 49-10722 A, JP 49-46733 A, JP 50-16525 A, JP 50-113221 A, JP 50-161236 A, JP 50-99525 A, JP 50-160034 A, JP 51-43131 A, JP 51-106419 A, JP 51-7917 A, JP 51-32322 A, JP 51-151125 A, JP 51-151126 A, JP 51-151127 A, JP 51-129229 A, JP 52-127974, JP 52-80023 A, JP 53-84712 A, JP 53-146622 A, JP 54-14224 A, JP 54-48520 A, JP 55-7762 A, JP 56-55942 A, JP 56-114944 A, JP 56-114945 A, JP 57-8456 B, JP 57-12130 B, JP 57-12135 B, JP 58-9408 B, etc. Examples of the high-molecular-weight, fluorine-containing compounds include compounds described in U.S. Pat. Nos. 4,175,969, 4,087,394, 4,016,125, 3,676,123, 3,679,411, 4,304,852, JP 52-129520 A, JP 54-158222 A, JP 55-57842 A, JP 57-11342 A, JP 57-19735 A, JP 57-179837 A, "General Remarks of Chemistry, No. 27, New Fluorine Chemistry" edited by The Chemical Society of Japan, 1980, "Functional, Fluorine-Containing, Macromolecules" edited by The Nikkan Kogyo Shimbun, Ltd., 1982, etc. These fluorine-containing compounds can be produced by the methods described in the above references or synthesized by the fluorination of the corresponding hydrocarbons. The fluorination of hydrocarbons may be carried out by the methods described in "New Lecture on Experimental Chemistry" Vol. 14 [I], issued by Maruzen Co., Ltd., 1977, pages 308 to 331.

Preferable examples of the fluorine-containing compounds usable in the present invention will be illustrated below.

(a) Fluorine-containing Surfactants

 (1)

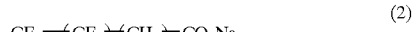 (2)

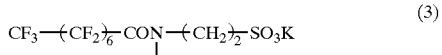 (3)

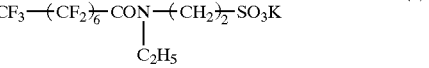 (4)

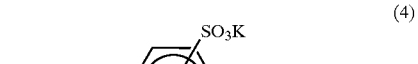 (5)

 (6)

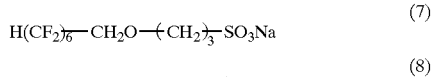 (7)

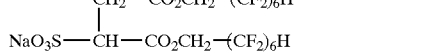 (8)

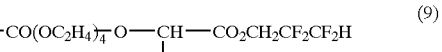 (9)

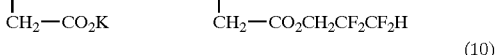 (10)

 (11)

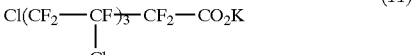 (12)

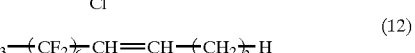 (13)

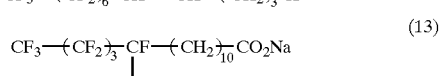

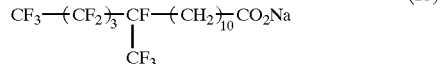

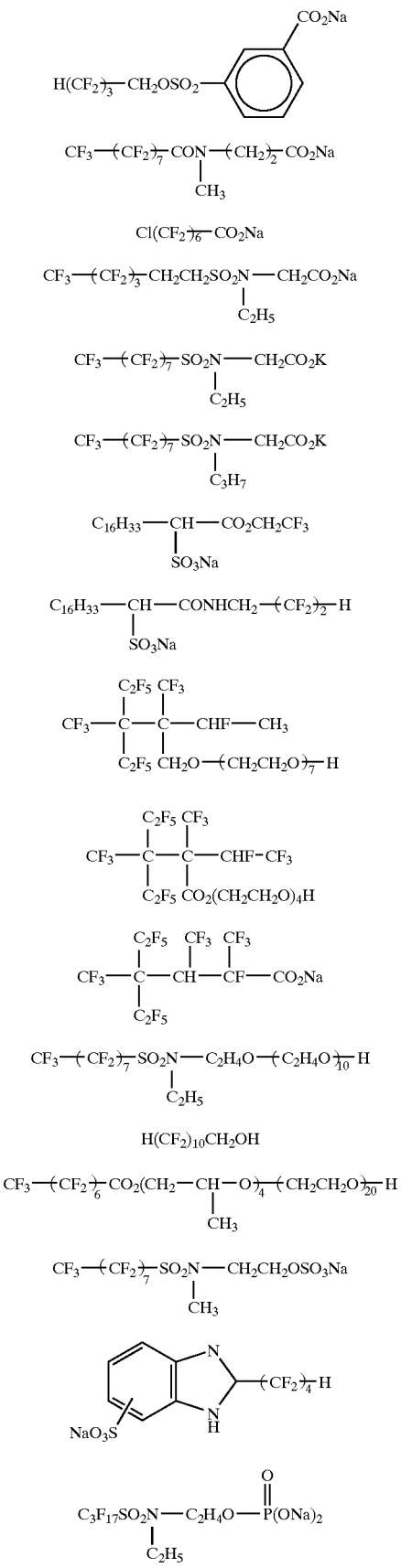
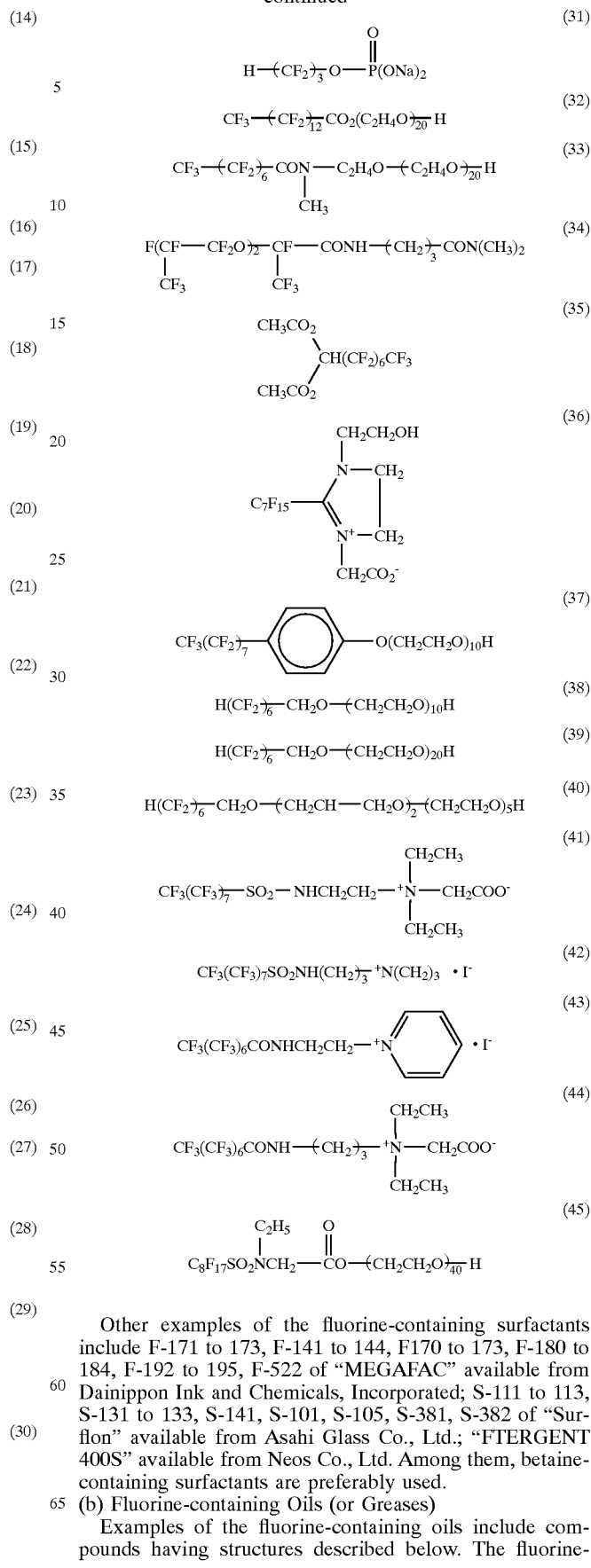

Other examples of the fluorine-containing surfactants include F-171 to 173, F-141 to 144, F170 to 173, F-180 to 184, F-192 to 195, F-522 of "MEGAFAC" available from Dainippon Ink and Chemicals, Incorporated; S-111 to 113, S-131 to 133, S-141, S-101, S-105, S-381, S-382 of "Surflon" available from Asahi Glass Co., Ltd.; "FTERGENT 400S" available from Neos Co., Ltd. Among them, betaine-containing surfactants are preferably used.

(b) Fluorine-containing Oils (or Greases)

Examples of the fluorine-containing oils include compounds having structures described below. The fluorine-containing oils may be modified ones such as isocyanate-modified, fluorine-containing oils, carboxyl-modified, fluorine-containing oils. For instance, those having OCN—C$_6$H$_3$(CH$_3$)NHCO— at molecule ends are isocyanate-modified compounds, those having —COOH are carboxyl-modified compounds, those having —CH$_2$OH, —CF$_2$CH$_2$(OCH$_2$CH$_2$)$_n$OH, etc. are alcohol-modified compounds, and those having —COOR (R: alkyl group) are ester-modified compounds.

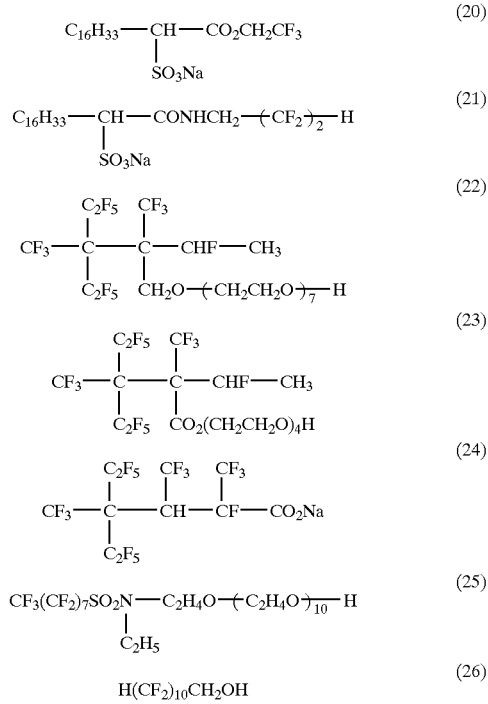

(c) Fluororesins

Examples of the fluororesins include fluoroethylene resins such as a tetrafluoroethylene resin, a trifluoroethylene resin and a difluoroethylene resin; tetrafluoroethylene telomers; trifluorochloroethylene resins; vinylidene fluoride resins; copolymers of tetrafluoroethylene and perfluoroalkoxyethylene; copolymers of tetrafluoroethylene and hexafluoropropylene; copolymers of tetrafluoroethylene and ethylene; modified fluororesins; etc.

The modified fluororesins may be obtained by modifying each of the above fluororesins in a range in which its properties themselves are not deteriorated, by copolymerizing it with a monofunctional or polyfunctional comonomer (vinyl compound, etc.) at the time of synthesis of each fluororesin, or by introducing a functional group having reactivity into the main or side chain of a polymer by graft copolymerization, substitution reaction, etc. Examples of the functional groups having reactivity include a carboxyl group, acid anhydrides, an epoxy group, a hydroxyl group, a chloromethyl group, an isocyanate group, an amino group, an aldehyde group, etc. Preferable among them are carboxyl-modified or epoxy-modified fluororesins, etc., from the aspects of easiness of introducing functional groups and reactivity with the amino group.

(d) Fluororubbers

Examples of the fluororubbers include copolymers (FKM) of vinylidene fluoride and perfluoropropene, copolymers of vinylidene fluoride and trifluorochloroethylene, alternating copolymers of tetrafluoroethylene and propylene, copolymers (FFKM) of tetrafluoroethylene and perfluoromethylvinylether, etc. The fluororubbers may be modified fluororubbers having functional groups having reactivity introduced into the main or side chains of polymers.

(C) Waxes

Examples of the waxes include microcrystalline wax, carnauba wax, paraffin wax, Fischer-Tropsch wax, montan wax, Sasol wax, various low-molecular-weight polyethylenes, Japan wax, beeswax, spermaceti, purified insect wax, wool wax, shellac wax, candelila wax, petrolatum, polyester waxes, partially modified waxes, fatty esters, fatty amides, polyethylene waxes, polypropylene waxes, sterol waxes, etc.

(D) Inorganic or Organic Fillers

Examples of the organic fillers include fillers made of fluorine-containing resins such as a tetrafluoroethylene resin, copolymers of ethylene and tetrafluoroethylene; organic resins such as polyethylene resins, polystyrene resins, acrylic resins, polyamide resins, benzoguanamine resins; etc. Examples of the inorganic fillers include silica, colloidal silica, alumina, kaolin, clay, calcium carbonate, talc, titanium dioxide, calcium carbonate, etc. The average particle diameter of the filler is preferably 0.1 μm to 10 μm. When the average particle diameter of the filler is less than 0.1 μm, a sufficient peeling function cannot be obtained. On the other hand, when the average particle diameter exceeds 10 μm, uneven transfer occurs.

(E) Surfactants

Examples of the surfactants include anionic surfactants, cationic surfactants, amphoteric surfactants, nonionic surfactants, fluorine-containing surfactants, etc. It is particularly preferable to use surfactants that are liquid at room temperature, such as the above fluorine-containing surfactants, phosphate surfactants, etc.

(F) Metallic Soaps

The metallic soaps may be long-chain aliphatic acid salts of non-alkaline metals, for instance, zinc stearate, calcium stearate, magnesium stearate, aluminum stearate, strontium stearate, barium stearate, lithium stearate, lithium 12-hydroxystearate, zinc laurate, calcium laurate, barium laurate, lead benzoate, zinc p-tert-butyl benzoate, barium p-tert-butyl benzoate, sodium stearate, potassium stearate, sodium oleate, etc. Usable as metal phosphates are stearyl acid phosphate, magnesium stearyl acid phosphate, aluminum stearyl acid phosphate, calcium stearyl acid phosphate, zinc stearyl acid phosphate, barium stearyl acid phosphate, and zinc behenic acid phosphate.

The content of the above peeling agent is preferably 0.01 to 50% by mass, more preferably 0.1 to 40% by mass, based on the resin for forming the peeling layer. Too much content of the peeling agent results in the precipitation of the peeling agent, likely leading to the deterioration of film quality. On the other hand, when the content of the peeling agent is too low, only a low transfer ratio is obtained. The peeling layer may contain other components in a range in which the effects of the present invention are not hindered. The peeling layer is preferably formed by a wet method. Materials for the peeling layer are dissolved in an organic solvent at a desired concentration, and the resultant solution is applied to the temporary support. Coating methods are not particularly limited, as long as they can form the peeling layer having a thickness of 0.5 nm to 10 nm with a uniform thickness distribution after drying. Examples of the coating methods include a spin-coating method, a gravure-coating method, a dip-coating method, a casting method, a die-coating method, a roll-coating method, a bar-coating method, an extrusion-coating method, an ink-jet-coating method, etc.

The peeling layer has a maximum surface roughness Rmax of 0 to 50, preferably 0 to 25, particularly preferably 0.0001 to 10 according to JIS B 0601-1982, assuming that thickness of the organic layer in the transfer material is 100. Rmax exceeding 50 undesirably leads to decreased film-forming properties, film strength, etc., resulting in the deterioration of the film quality of the peeling layer, and decrease in a transfer ratio.

The measurement of the maximum surface roughness Rmax may be carried out by an interatomic-force microscope method, a co-focus microscope method, a contact needle method, an optical microscopic interference method, a multi-interference method, an optically cutting method, etc., and the interatomic-force microscope method and the co-focus microscope method are preferable.

(4) Formation of Electroluminescent-element Layer on Temporary Support

The electroluminescent-element layer may contain a binder of a polymer, etc. as a constituent component. Examples of the polymer binders usable for the present invention include polyvinyl chloride, polycarbonates, polystyrene, polymethyl methacrylate, polybutyl methacrylate, polyesters, polysulfones, polyphenylene oxide, polybutadiene, hydrocarbon resins, ketone resins, phenoxy resins, polyamides, ethyl cellulose, polyvinyl acetate, ABS resins, polyurethanes, melamine resins, unsaturated polyesters, alkyd resins, epoxy resins, silicone resins, polyvinyl butyral, polyvinyl acetal, etc. The light-emitting organic layer containing at least one polymer binder can be easily formed with a large area by the solvent-coating method.

The organic layer containing a polymer as a binder is preferably formed by a coating method. Materials for the organic layer are dissolved in an organic solvent at a desired concentration, and the resultant solution is applied to the peeling layer. Coating methods are not particularly limited, as long as they can form the organic layer having a thickness of 200 nm or less with a uniform thickness distribution after drying. Examples of the coating methods include a spin-coating method, a gravure-coating method, a dip-coating method, a casting method, a die-coating method, a roll-coating method, a bar-coating method, an extrusion-coating method, an ink-jet-coating method, etc. Preferable among them is a high-productivity, roll-to-roll extrusion-coating method.

(5) Electroluminescent-element Layer

The electroluminescent-element layer is a layer constituting the organic electroluminescent device, and the organic layer of the present invention means a layer usable for organic EL devices. Specifically, it includes a light-emitting organic layer, an electron-transporting organic layer, a hole-transporting organic layer, an electron-injecting layer, a hole-injecting layer, etc., depending on its characteristics. In addition, various layers for improving light emission may be included. The dry thickness of the organic layer is preferably 6 nm to 600 nm, more preferably 6 nm to 450 nm, and particularly 6 nm to 300 nm.

(a) Light-emitting Organic Layer

The light-emitting organic layer comprises at least one light-emitting compound. Though not restrictive, the light-emitting compound may be a fluorescent compound or a phosphorescent compound. The fluorescent compound and the phosphorescent compound may be used in combination. In the present invention, the phosphorescent compound is preferably used from the viewpoints of the brightness of light emitted and a light-emitting efficiency. The term "derivatives" used below means compounds per se and their derivatives.

Examples of the fluorescent compounds used in this invention include benzoxazole derivatives; benzoimidazole derivatives; benzothiazole derivatives; styrylbenzene derivatives; polyphenyl derivatives; diphenylbutadiene derivatives; tetraphenylbutadiene derivatives; naphthalimido derivatives; coumarin derivatives; perylene derivatives; perynone derivatives; oxadiazole derivatives; aldazine derivatives; pyralidine derivatives; cyclopentadiene derivatives; bis(styryl)anthracene derivatives; quinacridon derivatives; pyrrolopyridine derivatives; thiadiazolopyridine derivatives; styrylamine derivatives; aromatic dimethylidine compounds; metal complexes such as 8-quinolinol metal complexes and derivatives thereof and rare-earth metal complexes; light-emitting polymer materials such as polythiophene derivatives, polyphenylene derivatives, polyphenylenevinylene derivatives and polyfluorene derivatives; etc. The fluorescent compounds may be used alone or in combination.

The phosphorescent compound preferably utilizes triplet excitons for light emission. The phosphorescent compound is preferably an ortho-metallation complex or a porphyrin complex. The porphyrin complex is preferably a porphyrin-platinum complex. The phosphorescent compounds may be used alone or in combination.

The ortho-metallation complex used in the present invention may be such a compound that is described in Akio Yamamoto, "Metalorganic Chemistry, Foundations and Applications," pages 150 to 232, Shokabo Publishing Co., Ltd., (1982); H. Yersin, "Photochemistry and Photophysics of Coordination Compounds," pages 71 to 77 and 135 to 146, Springer-Verlag, Inc. (1987), etc. Although ligands of the ortho-metallation complexes are not particularly limited, the ortho-metallation complexes generally have particular ligands. Preferred examples of the particular ligands include 2-phenylpyridine derivatives, 7,8-benzoquinoline derivatives, 2-(2-thienyl) pyridine derivatives, 2-(1-naphthyl) pyridine derivatives and 2-phenylquinoline derivatives. The derivatives may have a substituent. The ortho-metallation complexes may have other ligands than the particular ligands. Center metal atoms of the ortho-metallation complexes may be selected from transition metals. The center metals are preferably rhodium, platinum, gold, iridium, ruthenium or palladium. The organic compound layer comprising such an ortho-metallation complex is excellent in the brightness of light emitted and light-emitting efficiency. Complexes disclosed in U.S. patent application Ser. No. 20020055014 A1 may be used as the ortho-metallation complexes in the present invention.

The ortho-metallation complex used in the present invention may be synthesized by a known method disclosed in Inorg. Chem., 30, 1685, 1991; Inorg. Chem., 27, 3464, 1988; Inorg. Chem., 33, 545, 1994; Inorg. Chim. Acta, 181, 245, 1991; J. Organomet. Chem., 335, 293, 1987; J. Am. Chem. Soc., 107, 1431, 1985; etc.

Though not restrictive, the content of the light-emitting compound in the light-emitting organic layer is, for instance, preferably 0.1 to 70% by mass, more preferably 1 to 20% by mass. When the content of the light-emitting compound is less than 0.1% by mass or more than 70% by mass, the effect of adding the light-emitting compound tends to be insufficient.

The light-emitting organic layer may contain a host compound, a hole-transporting material, an electron-transporting material, an electrically inactive polymer binder, etc., if necessary. Incidentally, the functions of these materials may be able to be achieved by only one compound. For instance, a carbazole derivative function not only as a host compound but also as a hole-transporting material.

The host compound is a compound causing energy transfer from its excited state to the light-emitting compound, resulting in accelerating the light emission of the light-emitting compound. Examples of the host compounds include carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidene compounds, porphyrin compounds, anthraquinodimethane derivatives, anthrone derivatives, diphenylquinone derivatives, thiopyran dioxide derivatives, carbodimide derivatives, fluorenylidenemethane derivatives, distyrylpyrazine derivatives, anhydrides derived from heterocyclic tetracarboxylic acids having structures such as naphthalene and perylene, phthalocyanine derivatives, 8-quinolinol metal complexes and derivatives thereof, metallophthalocyanines, metal complexes containing benzoxazole or benzothiazole ligands, polysilane compounds, poly(N-vinylcarbazole) derivatives, aniline copolymers, electrically conductive polymers and oligomers such as oligothiophenes, polythiophenes and their derivatives, polythiophene derivatives, polyphenylene derivatives, polyphenylenevinylene derivatives, polyfluorene derivatives, etc. The host compounds may be used alone or in combination.

Though not restrictive, the hole-transporting materials may be low- or high-molecular-weight materials if they have any of functions of injecting holes from the anode into the light-emitting organic layer, transporting holes and blocking electrons from the cathode. Examples of the hole-transporting materials include carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidyne compounds, porphyrin compounds, polysilane compounds, poly(N-vinylcarbazole) derivatives, aniline copolymers, electrically conductive polymers and oligomers such as oligothiophenes, polythiophenes and their derivatives, polythiophene derivatives, polyphenylene derivatives, polyphenylenevinylene derivatives, polyfluorene derivatives, etc. These hole-transporting materials may be used alone or in combination.

The electron-transporting materials are not particularly limited as long as they have any of functions of injecting electrons from the cathode into the light-emitting organic layer, transporting electrons, and blocking holes from the anode. Examples of the electron-transporting materials include triazole derivatives, oxazole derivatives, oxadiazole derivatives, fluorenone derivatives, anthraquinodimethane derivatives, anthrone derivatives, diphenylquinone derivatives, thiopyran dioxide derivatives, carbodimide derivatives, fluorenylidenemethane derivatives, distyrylpyrazine derivatives, anhydrides derived from heterocyclic tetracarboxylic acids having structures such as naphthalene and perylene, phthalocyanine derivatives, 8-quinolinol metal complexes and derivatives thereof, metallophthalocyanines, metal complexes containing benzoxazole or benzothiazole ligands, aniline copolymers, electrically conductive polymers and oligomers such as oligothiophenes, polythiophenes and their derivatives, polythiophene derivatives, polyphenylene derivatives, polyphenylenevinylene derivatives, polyfluorene derivatives, etc. These electron-transporting materials may be used alone or in combination.

The dry thickness of the light-emitting organic layer is preferably 2 nm to 200 nm, more preferably 2 nm to 150 nm, and particularly 2 nm to 100 nm. When the dry thickness of the light-emitting organic layer exceeds 200 nm, driving voltage is likely to rise. On the other hand, when the thickness of the light-emitting organic layer is less than 2 nm, short-circuiting is likely to occur in the organic electroluminescent device.

(b) Hole-transporting Organic Layer

The organic thin-film device may comprise a hole-transporting organic layer made of the above hole-transporting material, if necessary. The hole-transporting organic layer may contain the above polymer binder. The dry thickness of the hole-transporting organic layer is preferably 2 nm to 200 nm, more preferably 2 nm to 150 nm, further preferably 2 nm to 100 nm. When the dry thickness exceeds 200 nm, driving voltage is likely to rise. On the other hand, when it is less than 2 nm, short-circuiting is likely to occur in the organic electroluminescent device.

(c) Electron-transporting Organic Layer

The organic thin-film device may have an electron-transporting organic layer made of the above electron-transporting material, if necessary. The electron-transporting organic layer may contain the above polymer binder. The dry thickness of the electron-transporting organic layer is preferably 2 nm to 200 nm, more preferably 2 nm to 150 nm, further preferably 2 nm to 100 nm. When the dry thickness exceeds 200 nm, driving voltage is likely to rise. On the other hand, when it is less than 2 nm, short-circuiting is likely to occur in the organic electroluminescent device.

[2] Production of Organic Electroluminescent Device

The production method of the organic electroluminescent device of the present invention is characterized by using a transfer material having a peeling layer and an organic layer formed on a temporary support, to transfer the organic layer to a substrate by a peeling transfer method. The peeling transfer method comprises the steps of heating and/or pressing the transfer material to soften the organic layer, which is adhered to a receiving surface of the substrate, and peeling the temporary support so that only the organic layer remains on the receiving surface. With a peeling layer formed on the temporary support of the transfer material, and with the organic layer formed on the peeling layer, a transfer ratio can be increased in the peeling transfer method. Heating may be generally carried out by a known means, and heating means such as a laminator, an infrared heater, a roller heater, a laser, a thermal head, etc. may be used. Preferable among them are a laminator, an infrared heater, a roller heater, etc. Usable as a thermal head may be a laminator such as First Laminator VA-400III available from Taisei Laminator K. K., a thermal head of a thermal transfer printer, etc.

The transfer temperature may vary depending on the materials of the organic layer and the heating member. It is, however, preferably 40° C. to 250° C., more preferably 50° C. to 200° C., particularly 60° C. to 180° C. It should be noted that a preferred range of the transfer temperature is related to the heat resistance of the heating member, the transfer material and the substrate, meaning that as the heat resistance increases, the transfer temperature is elevated accordingly.

FIG. 1 shows one example of apparatuses for carrying out the method of the present invention for producing the organic thin-film device. The transfer material 110 having a peeling layer 131 and an organic layer 112 formed on a temporary support 111 is supplied from a transfer material-winding roll 113. A transfer apparatus comprises a heating (pressing) roll 121 and a pressing (heating) roll 122. A substrate 100 constituted by a substrate support 101 and a cathode or anode 102 is arranged between the heating (pressing) roll 121 and the pressing (heating) roll 122, and a transfer material 110 is supplied between the heating (pressing) roll 121 and the cathode or anode 102 of the substrate 100, such that the cathode or anode 102 of the substrate 100 is brought into contact with the organic layer 112 of the transfer material 110. By heating or pressing by the heating (pressing) roll 121, or by heating while pressing by the heating (pressing) roll 121 and the pressing (heating) roll 122, the organic layer 112 is transferred onto the cathode or anode 102 of the substrate 100. The remaining temporary support 111 is wound by a temporary support-winding roll 114.

In the present invention, the step of transferring the organic layer 112 and the step of peeling the temporary support 111 may be repeated to laminate a plurality of organic layers on the substrate. A plurality of organic layers may have the same or different compositions. The same composition is advantageous in preventing the lack of a layer by poor transfer and peeling. In the case of forming different layers, it is possible to provide a design having improved light-emitting efficiency with separate functions assigned to different layers. It is possible to laminate, for instance, a light-emitting organic layer/an electron-transporting organic layer/an electron-injecting layer, or a hole-injecting layer/a hole-transporting organic layer/a light-emitting organic layer/an electron-transporting organic layer/an electron-injecting layer, onto a receiving surface by the transfer method of the present invention. In this case, lest that a previous transfer layer is reversely transferred to a next transfer layer, the heating temperature of the previous transfer material is preferably equal to or higher than that of the next transfer material.

The organic layer transferred onto the substrate, or a new organic layer transferred onto the previously transferred organic layer is preferably reheated, if necessary. A surface treatment for improving the adhesiveness of a receiving surface may be carried out between the previous transferring step and the next transferring step, such that the previous transfer layer is not reversely transferred onto the next transfer layer. Such surface treatment includes, for instance, an activation treatment such as a corona discharge treatment, a flame treatment, a glow discharge treatment, a plasma treatment, etc. When the surface treatment is carried out, the transfer temperature of the previous transfer material may be lower than that of the next transfer material, unless reverse transfer occurs.

The production method of the organic electroluminescent device of the present invention may comprise the step of using a transfer material having a peeling layer and an organic layer formed on a temporary support, to transfer the organic layer to a substrate by a peeling transfer method, and the step of bonding the organic layer formed by the peeling-transfer method to a substrate having at least one of an electrode, a transparent conductive layer and an organic layer. The bonding method is a method for bonding at least two surfaces by adhesion, pressure bonding, fusion, etc. Specifically, it is a method for overlapping an organic layer transferred to a receiving surface, and a substrate provided with at least one of an electrode, a transparent conductive layer and an organic layer, and heating and/or pressing them to soften the organic layer, thereby adhering the organic layer to the substrate provided with at least one of an electrode, a transparent conductive layer and an organic layer. In the bonding method used in the present invention, heating and pressing may be carried out alone or in combination. The heating and pressing may be carried out by the same means as in the peeling transfer method.

[3] Organic Electroluminescent Device (1) Structure

The overall structure of the organic thin-film device may be any one of the following laminate structures formed on a substrate support in the described orders or in orders opposite thereto:

(a) Transparent conductive layer/light-emitting organic layer/rear-surface electrode;
(b) Transparent conductive layer/light-emitting organic layer/electron-transporting organic layer/rear-surface electrode;
(c) Transparent conductive layer/hole-transporting organic layer/light-emitting organic layer/electron-transporting organic layer/rear-surface electrode;
(d) Transparent conductive layer/hole-transporting organic layer/light-emitting organic layer/rear-surface electrode;
(e) Transparent conductive layer/light-emitting organic layer/electron-transporting organic layer/electron-injecting layer/rear-surface electrode;
(f) Transparent conductive layer/hole-injecting layer/hole-transporting organic layer/light-emitting organic layer/electron-transporting organic layer/electron-injecting layer/rear-surface electrode, etc.

The light-emitting organic layer comprises a fluorescent compound and/or a phosphorescent compound, and the emitted light is generally taken out from the transparent conductive layer. Specific examples of compounds used in each organic layer are described, for instance, in "Organic EL Display" (Technotimes Co., Separate Volume of "Monthly Display," the October issue of 1998), etc.

(2) Substrate Support

Examples of materials used for the substrate support include inorganic materials such as yttrium-stabilized zirconia (YSZ) and glass; polymers such as polyesters (polyethylene terephthalate, polybutylene terephthalate, polyethylene naphthalate, etc.), polystyrenes, polycarbonates, polyether sulfone, polyarylates, allyldiglycolcarbonate, polyimides, polycyclolefins, norbornene resins, poly(chlorotrifluoroethylene), Teflon®, polytetrafluoroethylene-polyethylene copolymers; etc. The substrate support may be made of one material or a plurality of materials. Preferable among these materials are the above polymers that can produce a flexible organic, thin-film device, and more preferable are polyesters, polycarbonates, polyether sulfone, fluorine-containing polymers such as polychlorotrifluoroethylene, Teflon® and polytetrafluoroethylene-polyethylene copolymers, which are excellent in heat resistance, dimensional stability, solvent resistance, electric insulation and workability with little gas permeability and hygroscopicity.

The shape, structure and size of the substrate support may be appropriately determined in accordance with purposes and applications of the organic thin-film device. The substrate support is generally in a shape of plate or sheet. The substrate support may have a single-layer structure or a multi-layer structure. The substrate support may be composed of one member or a plurality of members. Though the substrate support may be colorless or colored transparent, it is preferably colorless transparent so that light emitted from the light-emitting organic layer is not scattered or attenuated.

A moisture permeation-inhibiting layer (gas barrier layer) may be formed on one or both surfaces of the substrate support. The gas barrier layer is preferably made of an inorganic compound such as silicon nitride, silicon oxide, etc. The gas barrier layer can be formed by a radio frequency sputtering method, etc. Further, a hard coating layer and an undercoating layer may be formed on the substrate support, if necessary.

(3) Electrode (Cathode or Anode)

Any of the transparent conductive layer and the rear-surface electrode may be used as a cathode or an anode, which is determined by the composition of the organic electric-field-light-emitting device.

(a) Transparent Conductive Layer (Transparent Electrode)

The transparent conductive layer can function not only as an anode for supplying holes to the organic compound layer but also as a cathode. The transparent conductive layer will be explained below in a case where it acts as the anode.

The shape, structure and size of a transparent conductive layer usually is not restrictive, and may be properly selected in accordance with the applications and purposes of the organic electroluminescent device. The transparent conductive layer may be made of metals, alloys, metal oxides, electrically conductive compounds, mixtures thereof, etc. The anode is preferably made of a material having a work function of 4 eV or more. Examples of the materials for the anode include antimony-doped tin oxide (ATO); fluorine-doped tin oxide (FTO); semiconductive metal oxides such as tin oxide, zinc oxide, indium oxide, indium tin oxide (ITO) and indium zinc oxide (IZO); metals such as gold, silver, chromium and nickel; mixtures and laminates of the metals and conductive metal oxides; inorganic, conductive compounds such as copper iodide and copper sulfide; organic, conductive compounds such as polyaniline, polythiophene and polypyrrole; laminates of the organic, conductive compounds and ITO; etc.

The method for forming the transparent conductive layer on the substrate support may be appropriately selected from wet methods such as a printing method and a coating method; physical methods such as a vacuum deposition method, a sputtering method and an ion-plating method; chemical methods such as a CVD method and a plasma CVD method; etc., depending on the materials used therefor. For example, when the transparent conductive layer is made of ITO, it may preferably be formed by a DC or RF sputtering method, a vapor deposition method, an ion-plating method, etc. In addition, when the transparent conductive layer is made of an organic, conductive compound, it may be formed by a wet method.

The patterning of the transparent conductive layer may be conducted by a chemical etching method such as a photolithography method, a physical etching method using laser beams, a vacuum vapor deposition method or a sputtering method with a mask, a lift-off method, a printing method, etc.

Though not restrictive, the position of the transparent, conductive layer formed in the organic electroluminescent device may be appropriately determined in accordance with the applications and purposes of the organic, thin-film device. The transparent, conductive layer is preferably formed on the substrate support. The transparent, conductive layer may be formed on all or part of the substrate support surface.

The thickness of the transparent conductive layer may be properly controlled depending on the material used therefor. The thickness of the transparent conductive layer is generally 10 nm to 50 µm, preferably 50 nm to 20 µm. The resistance of the transparent conductive layer is preferably $10^3$ Ω/square or less, more preferably $10^2$ Ω/square or less. The transparent, conductive layer may be colorless transparent or colored transparent. The light transmittance of the transparent conductive layer is preferably 60% or more, more preferably 70% or more, to allow light emission from the transparent conductive layer side. The light transmittance can be measured by a known method using a spectrophotometer.

Further, electrodes described in detail in "Developments of Transparent Conductive Films" supervised by Yutaka Sawada, CMC Publishing Co., Ltd., 1999, etc. may be used in the present invention. Particularly in the case of using a low-heat-resistance plastic substrate support, it is preferable that the transparent, conductive layer is made of ITO or IZO and formed at a low temperature of 150° C. or lower.

(b) Rear-surface Electrode

The rear-surface electrode functions as a cathode for injecting electrons into the organic compound layer, though it may function as an anode. The rear-surface electrode will be explained below in a case where it acts as a cathode.

Though not restrictive, the shape, structure and size of the rear-surface electrode may be appropriately selected in accordance with the applications and purposes of the organic thin-film device. The rear-surface electrode may be made of metals, alloys, metal oxides, electrically conductive compounds, mixtures thereof, etc. The rear-surface electrode is preferably made of a material having a work function of 4.5 eV or less. Examples of the materials used for the rear-surface electrode include alkali metals such as Li, Na, K and Cs; alkaline earth metals such as Mg and Ca; gold; silver; lead; aluminum; a sodium-potassium alloy; a lithium-aluminum alloy; a magnesium-silver alloy; indium; rare earth metals such as ytterbium; etc. Although the materials may be used alone, the rear-surface electrode is preferably made of a plurality of materials to improve both of stability and electron injection property. Preferable among the above materials are alkali metals and alkaline earth metals from the viewpoint of the electron injection property, and aluminum-based materials from the viewpoint of stability during storage. Usable as the aluminum-based materials are aluminum itself and aluminum-based alloys and mixtures containing 0.01 to 10% by mass of alkali metals or alkaline earth metals, such as a lithium-aluminum alloy, a magnesium-aluminum alloy, etc. Usable as materials for the rear-surface electrode are also described in detail in JP 2-15595 A, JP 5-121172 A, etc.

Though not restrictive, the method for forming the rear-surface electrode may be appropriately selected from wet methods such as a printing method and a coating method; physical methods such as a vacuum deposition method, a sputtering method and an ion-plating method; chemical methods such as a CVD method and a plasma CVD method; etc., depending on the materials used therefor. In the case of using a plurality of materials for the rear-surface electrode, the materials may be sputtered simultaneously or successively. The patterning of the rear-surface electrode can be carried out in the same manner as in the transparent, conductive layer.

Although the position of the rear-surface electrode formed in the organic electroluminescent device may be appropriately determined in accordance with the applications and purposes of the organic electroluminescent device, the rear-surface electrode is preferably formed on the organic compound layer. The rear-surface electrode may be formed on all or part of the organic compound layer surface. Further, a dielectric layer may be formed between the rear-surface electrode and the organic compound layer. The dielectric layer may be made of a fluorinated alkali or alkaline earth metal, having a thickness of 0.1 nm to 5 nm. The dielectric layer may be formed by a vacuum vapor deposition method, a sputtering method, an ion-plating method, etc.

The thickness of the rear-surface electrode may be properly controlled depending on the material used therefor. The thickness of the rear-surface electrode is generally 10 nm to 5 μm, preferably 50 nm to 1 μm. The rear-surface electrode may be transparent or opaque. The transparent rear-surface electrode may be a laminate composed of a thin layer of the above-mentioned material having a thickness of 1 nm to 10 nm and a transparent, conductive layer of ITO, IZO, etc.

(4) Patterning

To form the organic layer in a fine pattern, a mask (fine mask) having openings in a fine pattern may be used. Though not restrictive, the mask is preferably made of highly durable, inexpensive materials such as metals, glass, ceramics, heat-resistant resins, etc. A plurality of materials may be used in combination. The thickness of the mask is preferably 2 μm to 100 μm, more preferably 5 μm to 60 μm from the viewpoint of mechanical strength and the transfer accuracy of the organic layer.

The mask preferably has tapered openings having larger diameters on the transfer material side than the substrate side, in order that the organic layer of the transfer material is adhered to an underlayer (the transparent conductive layer or the other organic layer) in precisely the same shape as each opening of the mask.

It is also preferable to use a patterning method, in which a substrate is overlapped with a transfer material surface provided with a ragged pattern, so that an organic layer formed in recesses of the transfer material is transferred to the substrate. With a press member having a surface raggedness in a predetermined pattern pressed onto a surface of the organic layer formed on the temporary support of the transfer material, the surface of the transfer material can be provided with a ragged pattern corresponding to that of the press member. A plurality of transfer materials may be formed continuously by forming a plurality of organic layers having different compositions on a single temporary support. By repeating transfer onto a substrate with the transfer materials provided with a plurality of different organic layers, it is possible to produce an organic layer pattern constituted by a plurality of organic layers having different compositions.

(5) Other Layers

As layers constituting the organic electroluminescent device, it is preferable to form a protection layer and a sealing layer to prevent the light-emitting performance from deteriorating. The transfer material may further be provided with a peeling layer between the temporary support and the organic layer, and an adhesive layer between the organic layer and the receiving surface to improve transferability, unless the light-emitting performance is affected.

(a) Protective Layer

The organic electroluminescent device of the present invention may comprise the protective layer disclosed in JP 7-85974 A, JP 7-192866 A, JP 8-22891 A, JP 10-275682 A and JP 10-106746 A, etc. The protective layer is generally formed on the uppermost surface of the organic electroluminescent device. For example, in the organic thin-film device in which the substrate support, the transparent conductive layer, the organic compound layers and the rear-surface electrode are formed in this order, the uppermost surface is the outer surface of the rear-surface electrode. Further, for instance, in the organic thin-film device in which the substrate support, the rear-surface electrode, the organic compound layers and the transparent conductive layer are formed in this order, the uppermost surface is the outer surface of the transparent conductive layer. The shape, size and thickness of the protective layer are not particularly limited. The protective layer may be made of any material that can prevent substances such as water and oxygen degrading the function of the organic electroluminescent device from entering or penetrating into the device. Silicon monoxide, silicon dioxide, germanium monoxide, germanium dioxide, etc. may be used for the protective layer.

Though not restrictive, the protective layer may be formed by a vacuum deposition method, a sputtering method, an activated sputtering method, a molecular beam epitaxy (MBE) method, a cluster ion beam method, an ion-plating method, a plasma polymerization method, a plasma CVD method, a laser CVD method, a thermal CVD method, a coating method, etc.

(b) Sealing Layer

The sealing layer is preferably formed in the organic electroluminescent device to prevent water and oxygen from entering or permeating into the device. Examples of materials for the sealing layer include copolymers of tetrafluoroethylene and at least one comonomer, fluorine-containing copolymers having cyclic structures in their main chains, polyethylene, polypropylene, polymethyl methacrylate, polyimides, polyureas, polytetrafluoroethylene, polychlorotrifluoroethylene, polydichlorodifluoroethylene, copolymers of chlorotrifluoroethylene or dichlorodifluoroethylene and other comonomers, moisture-absorbing substances having water absorption of 1% or more, moisture-resistant substances having a water absorption of 0.1% or less, metals such as In, Sn, Pb, Au, Cu, Ag, Al, Ti and Ni, metal oxides such as MgO, SiO, $SiO_2$, $Al_2O_3$, GeO, NiO, CaO, BaO, $Fe_2O_3$, $Y_2O_3$ and $TiO_2$, metal fluorides such as $MgF_2$, LiF, $AlF_3$ and $CaF_2$, liquid fluorinated carbons such as perfluoroalkanes, perfluoroamines and perfluoroethers, dispersions prepared by adding substances for adsorbing moisture or oxygen to liquid fluorinated carbons, etc.

The organic compound layers are preferably sealed by sealing parts such as sealing plates and sealing containers to shield the device from moisture, oxygen, etc. from outside. The sealing parts may be formed only on the rear-surface electrode side. Alternatively, the entire light-emitting structure may be covered with the sealing parts. The shape, size and thickness of the sealing parts are not particularly limited as long as the sealing parts can seal and shield the organic compound layer from outside air. The sealing parts may be made of glass, stainless steel, metals such as aluminum, plastics such as polychlorotrifluoroethylene, polyesters and polycarbonates, ceramics, etc.

A sealing agent or an adhesive may be used to form the sealing parts on the light-emitting structure. In the case of covering the entire light-emitting structure with the sealing parts, the sealing parts may be partially heat-welded with each other without using a sealing agent. Usable as the sealing agent are ultraviolet-curing resins, thermosetting resins, two-part-type hardening resins, etc.

Further, a water-absorbing agent or an inert liquid may be filled between the light-emitting structure and the sealing parts. Though not restrictive, the water-absorbing agents may be barium oxide, sodium oxide, potassium oxide, calcium oxide, sodium sulfate, calcium sulfate, magnesium sulfate, phosphorus pentoxide, calcium chloride, magnesium chloride, copper chloride, cesium fluoride, niobium fluoride, calcium bromide, vanadium bromide, a molecular sieve, a zeolite, magnesium oxide, etc. Though not restrictive, the inert liquids may be paraffins, liquid paraffins, fluorine-containing solvents such as perfluoroalkanes, perfluoroamines and perfluoroethers; chlorine-containing solvents; silicone oils, etc.

The present invention will be explained in further detail by Examples below without intention of restricting the scope of the present invention defined by the claims attached hereto. Incidentally, the production of the transfer materials and the organic EL devices in Examples was conducted in a nitrogen-substituted gloved box.

EXAMPLE 1

(A) Production of Transfer Material 1

Bar-coated onto one side of a 188-µm-thick temporary support made of polyether sulfone available from Sumitomo Bakelite Co., Ltd. was a coating solution 1 for a peeling layer having a composition of 30 parts by mass of a polyester resin HP320 having a glass transition temperature of 62° C. and a softening point of 95° C. available from Nippon Synthetic Chemical Industry Co., Ltd., 10 parts by mass of a silicone-modified acrylic resin solution US-3700 available from TOAGOSEI CO., LTD., 30 parts by mass of methyl ethyl ketone, and 30 parts by mass of toluene. The coated liquid was dried at 80° C. in vacuum for 2 hours to form the peeling layer in a thickness of 3.0 µm on the temporary support.

The maximum surface roughness Rmax of the resultant peeling layer was measured by an interatomic-force microscope method according to JIS B 0601-1982. Sampling was conducted in a lattice pattern at a pitch of 0.05 nm in an area of 20,000 nm×20,000 nm, to carry out the measurement of Rmax using SPI3800N SPA-400 available from Seiko Instruments Inc. The results are shown in Table 1.

Next, bar-coated onto the peeling layer was a coating solution for a light-emitting organic layer having a composition of 40 parts by mass of polyvinyl carbazole having Mw of 63,000 available from Aldrich Chemical Co., 1 part by mass of tris(2-phenylpyridine) iridium complex (orthometallation complex), and 3,500 parts by mass of dichloroethane. The coated liquid was dried at room temperature to provide a transfer material 1 with a 13-nm-thick, light-emitting organic layer.

(B) Production of Organic Electroluminescent Device (1) Formation of Surface to be Coated A glass plate of 0.5 mm×2.5 cm×2.5 cm as a substrate support was placed in a vacuum chamber, to form transparent 0.2-µm-thick ITO thin-film electrodes thereon by DC magnetron sputtering using an ITO target containing 10% by mass of $SnO_2$ with an indium/tin molar ratio of 95/5, under the conditions that the substrate support was at a temperature of 250° C., and that an oxygen pressure was $1\times10^{-3}$ Pa. The transparent ITO thin film had a surface resistance of 10 Ω/square. The glass plate provided with the transparent electrodes was introduced into a washing vessel and washed with isopropyl alcohol (IPA), and then subjected to an oxygen plasma treatment.

(2) Formation of Organic Layer on Surface to be Coated

The surface of the oxygen-plasma-treated, transparent electrode was overlapped with the transfer material 1 on the side of the light-emitting organic layer, and caused to pass through a pair of rollers both heated at 160° C. at pressure of 0.3 MPa and at a speed of 0.05 m/minute, to press them while heating from the side of the temporary support of the transfer material 1. The temporary support was then peeled from the transfer material 1 to transfer a light-emitting organic layer onto the surface of the transparent electrode.

(3) Production of Rear-surface Electrode

A patterned mask for providing a light-emitting area of 5 mm×5 mm was placed on the transferred, light-emitting organic layer. Each masked sample was vapor-deposited with magnesium and silver (mole ratio of 10/1) at a thickness of 0.25 µm and silver at a thickness of 0.3 µm to form a rear-surface electrode in a vapor deposition chamber. Aluminum lead wires were then connected to the transparent electrode functioning as an anode and the rear-surface electrode, thereby finishing a laminate structure.

(4) Sealing

The laminate structure was placed in a gloved box filled with a nitrogen gas, and sealed in a sealing glass container by an ultraviolet-curing adhesive "XNR5493" available from Nagase-Chiba Co., to produce an organic EL device.

(E) Evaluation

The transfer ratio of the organic layer to the substrate was evaluated by the following method. The organic layer of the transfer material 1 was transferred to each of ten substrates on the side of a transparent electrode, and the resultant organic layer was observed with respect to transfer unevenness. The evaluation standards of the transfer unevenness are given below. The results are shown in Table 1.

Transfer ratio was 90% or more in all samples: Good

Transfer ratio was less than 90%: Poor

EXAMPLE 2

A transfer material and an organic electroluminescent device were produced and evaluated in the same manner as in Example 1 except for using a coating solution 2 for a peeling layer having a composition of 18 parts by mass of a polyester resin HP301 having a glass transition temperature of 62° C. and a softening point of 105° C. available from The Nippon Synthetic Chemical Industry Co., Ltd., 2 parts by mass of silicone (Orgatics SI220 available from Matsumoto Trading Co., Ltd.) reacting with a peeling layer-forming resin, 40 parts by mass of methyl ethyl ketone, and 40 parts by mass of toluene, in place of the coating solution 1 for a peeling layer. The results are shown in Table 1.

EXAMPLE 3

A transfer material and an organic electroluminescent device were produced and evaluated in the same manner as in Example 1 except for using a coating solution 3 for a peeling layer having a composition of 17 parts by mass of a polyester resin HP320 having a glass transition temperature of 62° C. and a softening point of 95° C. available from The Nippon Synthetic Chemical Industry Co., Ltd., 3 parts by mass of silicone oil KF54 available from Shin-Etsu Chemical Co., Ltd., 40 parts by mass of methyl ethyl ketone, and 40 parts by mass of toluene, in place of the coating solution 1 for a peeling layer. The results are shown in Table 1.

EXAMPLE 4

A transfer material and an organic electroluminescent device were produced and evaluated in the same manner as in Example 1 except for using a coating solution 4 for a peeling layer having a composition of 15 parts by mass of a polyester resin HP301 having a glass transition temperature of 62° C. and a softening point of 105° C. available from The Nippon Synthetic Chemical Industry Co., Ltd., 5 parts by mass of vinyl-modified silicone XF40-A1987 available from GE Toshiba Silicones Co., Ltd., 0.01 part by mass of a platinum catalyst, 40 parts by mass of methyl ethyl ketone, and 40 parts by mass of toluene, in place of the coating solution 1 for a peeling layer. The results are shown in Table 1.

EXAMPLE 5

A transfer material and an organic electroluminescent device were produced and evaluated in the same manner as in Example 1 except for using a coating solution 5 for a peeling layer having a composition of 16 parts by mass of a polyester resin HP301 having a glass transition temperature of 62° C. and a softening point of 105° C. available from The Nippon Synthetic Chemical Industry Co., Ltd., 4 parts by mass of epoxy-modified silicone XF42-A4439 available from GE Toshiba Silicones Co., Ltd., 40 parts by mass of methyl ethyl ketone, and 40 parts by mass of toluene, in place of the coating solution 1 for a peeling layer. The results are shown in Table 1.

EXAMPLE 6

A transfer material and an organic electroluminescent device were produced and evaluated in the same manner as in Example 1 except for using a coating solution 6 for a peeling layer having a composition of 30 parts by mass of a polyester resin HP320 having a glass transition temperature of 62° C. and a softening point of 95° C. available from The Nippon Synthetic Chemical Industry Co., Ltd., 1 part by mass of a fluorine-containing peeling agent FC430 available from Du Pont-Mitsui Fluorochemicals Co., LTD., 35 parts by mass of methyl ethyl ketone, and 35 parts by mass of toluene, in place of the coating solution 1 for a peeling layer. The results are shown in Table 1.

EXAMPLE 7

A transfer material and an organic electroluminescent device were produced and evaluated in the same manner as in Example 1 except for using a coating solution 7 for a peeling layer having a composition of 30 parts by mass of a polyester resin HP320 having a glass transition temperature of 62° C. and a softening point of 95° C. available from The Nippon Synthetic Chemical Industry Co., Ltd., 3 parts by mass of carnauba wax, 35 parts by mass of methyl ethyl ketone, and 35 parts by mass of toluene, in place of the coating solution 1 for a peeling layer. The results are shown in Table 1.

EXAMPLE 8

A transfer material and an organic electroluminescent device were produced and evaluated in the same manner as in Example 1 except for using a coating solution 8 for a peeling layer having a composition of 30 parts by mass of a polyester resin HP320 having a glass transition temperature of 62° C. and a softening point of 95° C. available from The Nippon Synthetic Chemical Industry Co., Ltd., 3 parts by mass of Fischer-Tropsch Wax HI available from Sasol, 35 parts by mass of methyl ethyl ketone, and 35 parts by mass of toluene, in place of the coating solution 1 for a peeling layer. The results are shown in Table 1.

EXAMPLE 9

A transfer material and an organic electroluminescent device were produced and evaluated in the same manner as in Example 1 except for using a coating solution 9 for a peeling layer having a composition of 30 parts by mass of a polyester resin HP320 having a glass transition temperature of 62° C. and a softening point of 95° C. available from The Nippon Synthetic Chemical Industry Co., Ltd., 3 parts by mass of sterol wax, 35 parts by mass of methyl ethyl ketone, and 35 parts by mass of toluene, in place of the coating solution 1 for a peeling layer. The results are shown in Table 1.

EXAMPLE 10

A transfer material and an organic electroluminescent device were produced and evaluated in the same manner as in Example 1 except for forming the peeling layer in a thickness of 6 µm, and for using a coating solution 10 for a peeling layer having a composition of 30 parts by mass of a polyester resin HP320 having a glass transition temperature of 62° C. and a softening point of 95° C. available from The Nippon Synthetic Chemical Industry Co., Ltd., 0.6 parts by mass of silica particles having an average diameter of 5 µm, 35 parts by mass of methyl ethyl ketone, and 35 parts by mass of toluene, in place of the coating solution 1 for a peeling layer. The coating solution 10 for a peeling layer was prepared by dissolving a resin in a solvent and then dispersing silica particles. The results are shown in Table 1.

EXAMPLE 11

A transfer material and an organic electroluminescent device were produced and evaluated in the same manner as in Example 1 except for forming the peeling layer in a thickness of 6 µm, and for using a coating solution 11 for a peeling layer having a composition of 30 parts by mass of a polyester resin HP320 having a glass transition temperature of 62° C. and a softening point of 95° C. available from The Nippon Synthetic Chemical Industry Co., Ltd., 0.6 parts by mass of organic filler (Soken Chemical & Engineering Co., Ltd., MR-7G, PMMA particles, average particle diameter of 5 µm), 35 parts by mass of methyl ethyl ketone, and 35 parts by mass of toluene, in place of the coating solution 1 for a peeling layer. The results are shown in Table 1.

EXAMPLE 12

A transfer material and an organic electroluminescent device were produced and evaluated in the same manner as in Example 1 except for using a coating solution 12 for a peeling layer having a composition of 30 parts by mass of a polyester resin HP320 having a glass transition temperature of 62° C. and a softening point of 95° C. available from The Nippon Synthetic Chemical Industry Co., Ltd., 3 parts by mass of phosphate LBT-100 having a melting point of 70° C. available from Sakai Chemical Industry Co., Ltd., 35 parts by mass of methyl ethyl ketone, and 35 parts by mass of toluene, in place of the coating solution 1 for a peeling layer. The results are shown in Table 1.

EXAMPLE 13

A transfer material and an organic electroluminescent device were produced and evaluated in the same manner as in Example 1 except for using a coating solution 13 for a peeling layer having a composition of 30 parts by mass of a polyester resin HP320 having a glass transition temperature of 62° C. and a softening point of 95° C. available from The Nippon Synthetic Chemical Industry Co., Ltd., 3 parts by mass of a metallic soap (zinc stearate, SZ-2000, a melting point of 125° C.), 35 parts by mass of methyl ethyl ketone, and 35 parts by mass of toluene, in place of the coating solution 1 for a peeling layer. The results are shown in Table 1.

Comparative Example 1

A transfer material and an organic electroluminescent device were produced and evaluated in the same manner as in Example 1 except that a peeling layer was not formed on a temporary support. The results are shown in Table 1.

TABLE 1

| No. | Peeling Agent | Peeling layer Rmax | Transfer Ratio |
|---|---|---|---|
| Example 1 | Silicone-modified acrylic resin US-3700 available from TOAGOSEI CO., LTD. | 3 nm | Good |
| Example 2 | Silicone (Orgatics SI220 available from Matsumoto Trading Co., Ltd.) | 5 nm | Good |
| Example 3 | Silicone oil KF54 available from Shin-Etsu Chemical Co. | 3 nm | Good |
| Example 4 | Vinyl-modified silicone XF40-A1987 available from GE Toshiba Silicones Co., Ltd. | 2 nm | Good |
| Example 5 | Epoxy-modified silicone XF42-A4439 available from GE Toshiba Silicones Co., Ltd. | 1 nm | Good |
| Example 6 | Fluorine-containing peeling agent FC430 available from Du Pont-Mitsui Fluorochemicals Co., LTD. | 3 nm | Good |
| Example 7 | Carnauba wax | 5 nm | Good |
| Example 8 | Fischer-Tropsch Wax H1 available from Sasol | 3 nm | Good |
| Example 9 | Sterol wax | 5 nm | Good |
| Example 10 | Silica particles having average diameter of 5 μm | 6 nm | Good |
| Example 11 | Organic filler (Soken Chemical & Engineering Co., Ltd., MR-7G, PMMA particles having average diameter of 5 μm) | 5 nm | Good |
| Example 12 | Phosphate LBT-100 having melting point of 70° C. available from Sakai Chemical Industry Co., Ltd. | 3 nm | Good |
| Example 13 | Metallic soap (zinc stearate, SZ-2000 having melting point of 1250C) | 3 nm | Good |
| Com. Ex. 1 | None | — | Poor |

The transfer ratio of an organic layer to a substrate is improved by forming a peeling layer on a surface of a temporary support, on which the organic layer is formed, according to the present invention. Thus, an organic electroluminescent device excellent in light-emitting efficiency, the uniformity of light emission and durability can be produced at a low cost. In addition, because the organic layer is formed using the transfer material in the present invention, only reduced influence would be exerted by the defects (physical defects such as surface flatness, etc.) of the substrate or the organic layer, if any, resulting in good planar light emission.

What is claimed is:

1. A method for producing an organic electroluminescent device by using a transfer material, said transfer material comprising a temporary support, an electroluminescent element layer, and a peeling layer between said temporary support and said electroluminescent element layer, said method comprising the steps of:

contacting the electroluminescent layer side of said transfer material with an electrode layer side of a substrate, wherein said electrode layer is partially or wholly transparent or opaque; and transferring said at least one electroluminescent element layer to said electrode layer side of said substrate with at least one heating means and pressing means, wherein a maximum surface roughness Rmax (according to JIS B 0601-1982) of said peeling layer is not less than 0 and not more than 50, assuming that the thickness of said electroluminescent element layer is 100.

2. The method of claim 1, wherein said electroluminescent element layer is at least one electroluminescent layer and charge-transporting layer, provided that said transfer material does not contain a light-to-heat conversion layer.

3. The method of claim 1, wherein said at least one heating means and pressing means is selected from the group consisting of a laminator, an infrared heater and a roller heater.

4. The method of claim 1, further comprising a step of peeling said temporary support after said transferring step.

5. The method of claim 1, wherein a hole-transporting organic layer, a light-emitting organic layer and an electron-transporting organic layer are transferred in this order onto the substrate.

6. The method of claim 1, further comprising a step of laminating said substrate having said electroluminescent element to an electrode layer side of another substrate, thereby providing an organic electroluminescent device.

7. A method for producing an organic electroluminescent device by using a transfer material, said transfer material comprising a temporary support, an electroluminescent element layer, and a peeling layer between said temporary support and said electroluminescent element layer, said method comprising the steps of:

contacting the electroluminescent layer side of said transfer material with an electrode layer side of a substrate, wherein said electrode layer is partially or wholly transparent or opaque; and transferring said at least one electroluminescent element layer to said electrode layer side of said substrate by the application of heat and pressure, wherein a maximum surface roughness Rmax (according to JIS B 0601-1982) of said peeling layer is not less than 0 and not more than 50, assuming that the thickness of said electroluminescent element layer is 100.

8. The method of claim 7, wherein said heat and pressure are provided by a laminator, an infrared heater or a roller heater.

* * * * *